(12) United States Patent
Walton

(10) Patent No.: US 7,796,074 B2  
(45) Date of Patent: Sep. 14, 2010

(54) DIGITAL/ANALOGUE CONVERTER, CONVERTER ARRANGEMENT AND DISPLAY

(75) Inventor: Harry G. Walton, Beckley (GB)

(73) Assignee: Sharp Kabushiki Kaisha, Osaka (JP)

( * ) Notice: Subject to any disclaimer, the term of this patent is extended or adjusted under 35 U.S.C. 154(b) by 17 days.

(21) Appl. No.: 11/883,708

(22) PCT Filed: Apr. 3, 2006

(86) PCT No.: PCT/JP2006/307510

§ 371 (c)(1),  
(2), (4) Date: Aug. 3, 2007

(87) PCT Pub. No.: WO2006/107108

PCT Pub. Date: Oct. 12, 2006

(65) Prior Publication Data

US 2008/0136696 A1  Jun. 12, 2008

(30) Foreign Application Priority Data

Apr. 5, 2005 (GB) .................................. 0506868.9

(51) Int. Cl.  
*H03M 1/66* (2006.01)

(52) U.S. Cl. ........................................ 341/150; 341/144

(58) Field of Classification Search ............. 341/50–90, 341/144–150  
See application file for complete search history.

(56) References Cited

U.S. PATENT DOCUMENTS

| 4,380,756 | A | | 4/1983 | Worsman |
| 4,853,698 | A | | 8/1989 | Roessler |
| 4,937,578 | A | | 6/1990 | Shioda |
| 5,332,997 | A | | 7/1994 | Dingwall et al. |
| 5,453,757 | A | | 9/1995 | Date et al. |
| 5,764,216 | A | * | 6/1998 | Tanaka et al. .................. 345/87 |
| 5,796,384 | A | * | 8/1998 | Kim .............................. 345/87 |
| 5,889,480 | A | * | 3/1999 | Kim .............................. 341/50 |
| 6,154,121 | A | * | 11/2000 | Cairns et al. ................. 341/138 |

(Continued)

FOREIGN PATENT DOCUMENTS

EP   1 353 445 A2   10/2003

(Continued)

OTHER PUBLICATIONS

International Search Report dated May 2, 2006.

(Continued)

*Primary Examiner*—Lam T Mai  
(74) *Attorney, Agent, or Firm*—Harness, Dickey & Pierce, P.L.C.

(57) ABSTRACT

In one embodiment of the present invention, a switched capacitor digital/analog converter is provided, for example providing gamma correction in liquid crystal displays. The converter includes a plurality of conversion capacitors including first plates connected to an output line and second plates connectable via electronic switches to first or second reference voltages in accordance with the values of corresponding bits of an input word. The converter also includes a plurality of terminating capacitors, at least one of which is switchable in or out of circuit depending on the value of at least one of the bits of the input word. By suitable choice of capacitance values and reference voltages, a wide range of non-linear transfer functions can be provided by the converter.

23 Claims, 14 Drawing Sheets

U.S. PATENT DOCUMENTS

| | | | |
|---|---|---|---|
| 6,259,392 | B1 | 7/2001 | Choi et al. |
| 6,380,917 | B2 | 4/2002 | Matsueda et al. |
| 6,486,812 | B1 | 11/2002 | Tanaka |
| 6,570,411 | B1 * | 5/2003 | Bardsley et al. ............... 327/94 |
| 6,674,420 | B2 | 1/2004 | Matsueda et al. |
| 6,718,432 | B1 * | 4/2004 | Srinivasan ................ 711/108 |
| 6,731,232 | B1 | 5/2004 | Kearney |
| 6,781,415 | B2 * | 8/2004 | Clark et al. ................... 326/81 |
| 6,801,149 | B2 * | 10/2004 | Walton et al. .............. 341/150 |
| 6,922,165 | B2 | 7/2005 | Seymour |
| 7,061,418 | B2 * | 6/2006 | Zebedee .................... 341/150 |
| 7,187,310 | B2 * | 3/2007 | El-Sankary et al. ........ 341/120 |
| 7,236,116 | B2 * | 6/2007 | Hong ........................ 341/150 |
| 7,307,572 | B2 * | 12/2007 | Garrity et al. ............... 341/172 |
| 7,432,844 | B2 * | 10/2008 | Mueck et al. .............. 341/163 |
| 7,495,594 | B2 | 2/2009 | Horibata |
| 2002/0163457 | A1 | 11/2002 | Azami et al. |
| 2002/0186157 | A1 | 12/2002 | Tanaka |
| 2004/0004566 | A1 | 1/2004 | Walton et al. |
| 2005/0171991 | A1 | 8/2005 | Zebedee |

FOREIGN PATENT DOCUMENTS

| | | |
|---|---|---|
| GB | 2 217 128 A | 10/1989 |
| GB | 2 362 277 A | 11/2001 |
| GB | 2 388 725 A | 11/2003 |
| GB | 2 409 777 A | 7/2005 |
| JP | 57-073524 A | 5/1982 |
| JP | 57-123732 A | 8/1982 |
| JP | 11-296149 A | 10/1999 |
| WO | WO 2006/075769 A1 | 7/2006 |

OTHER PUBLICATIONS

UK Search Report for GB 0506868.9 dated Jun. 9, 2005.
International Search Report dated Feb. 28, 2006.
UK Search Report for GB 0500537.6 dated Apr. 25, 2005.
"LP-3: Late-News Poster: A 2.1—in QCIF+ CG-Silicon LCD with a Low Power Non-Linear DAC" (Zebedee et al.) [2004].

* cited by examiner

BACKGROUND ART

BACKGROUND ART

BACKGROUND ART

BACKGROUND ART

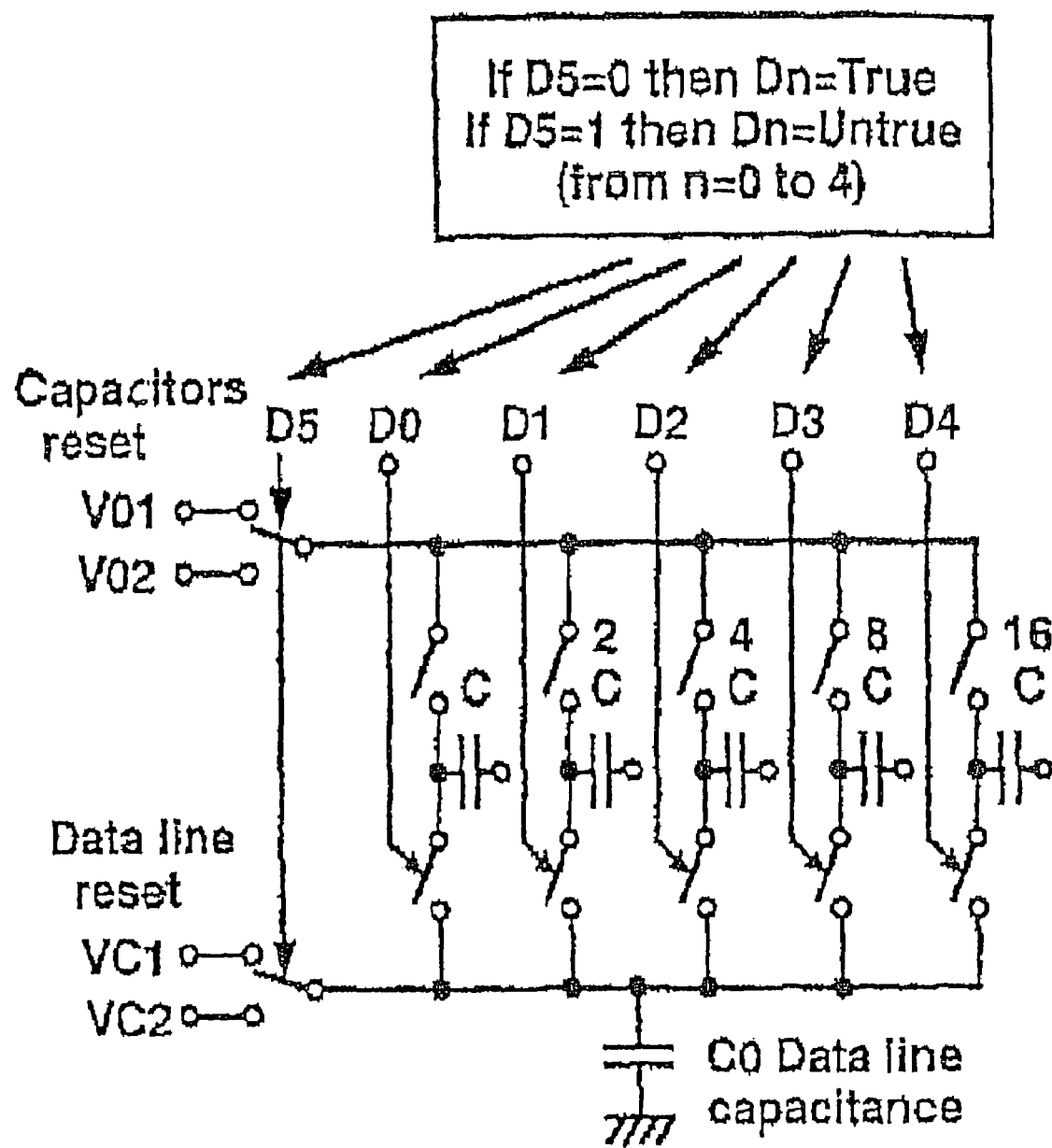
Figure 6: Prior Art

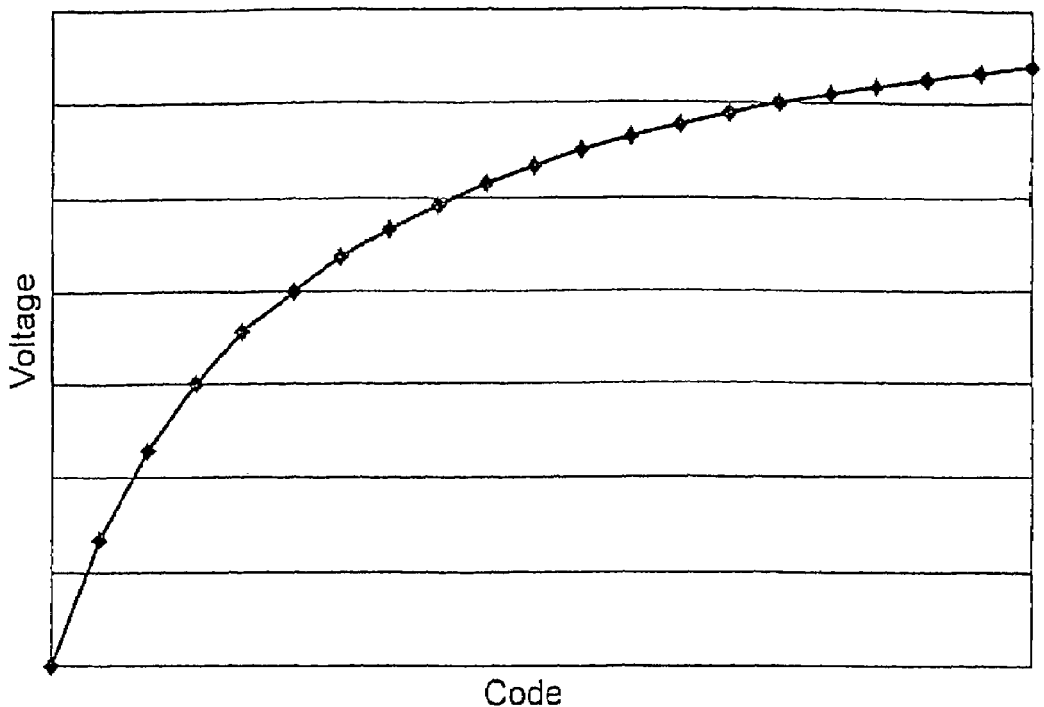
Figure 7: Prior Art
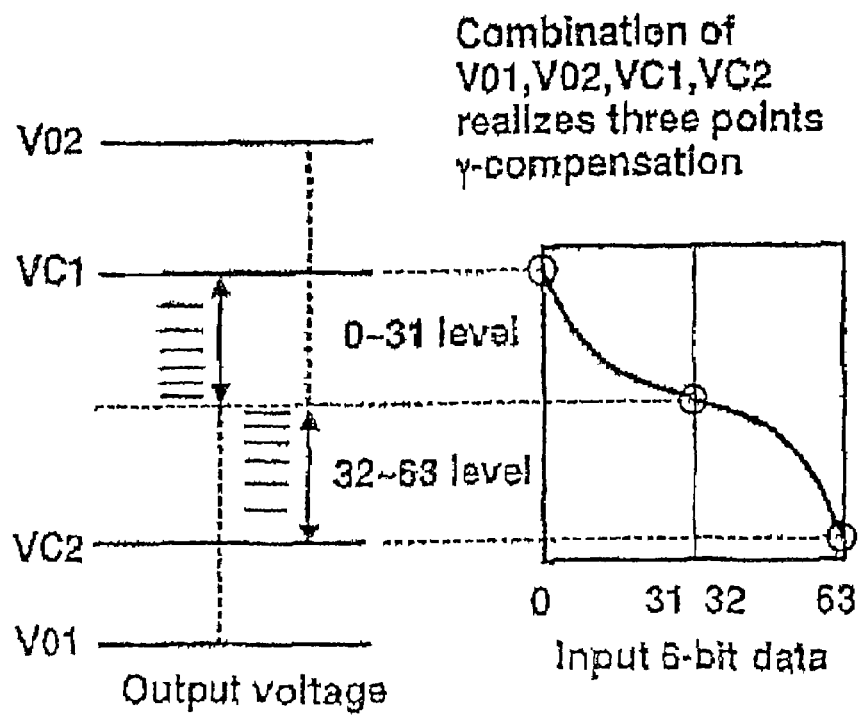
Figure 8: Prior Art

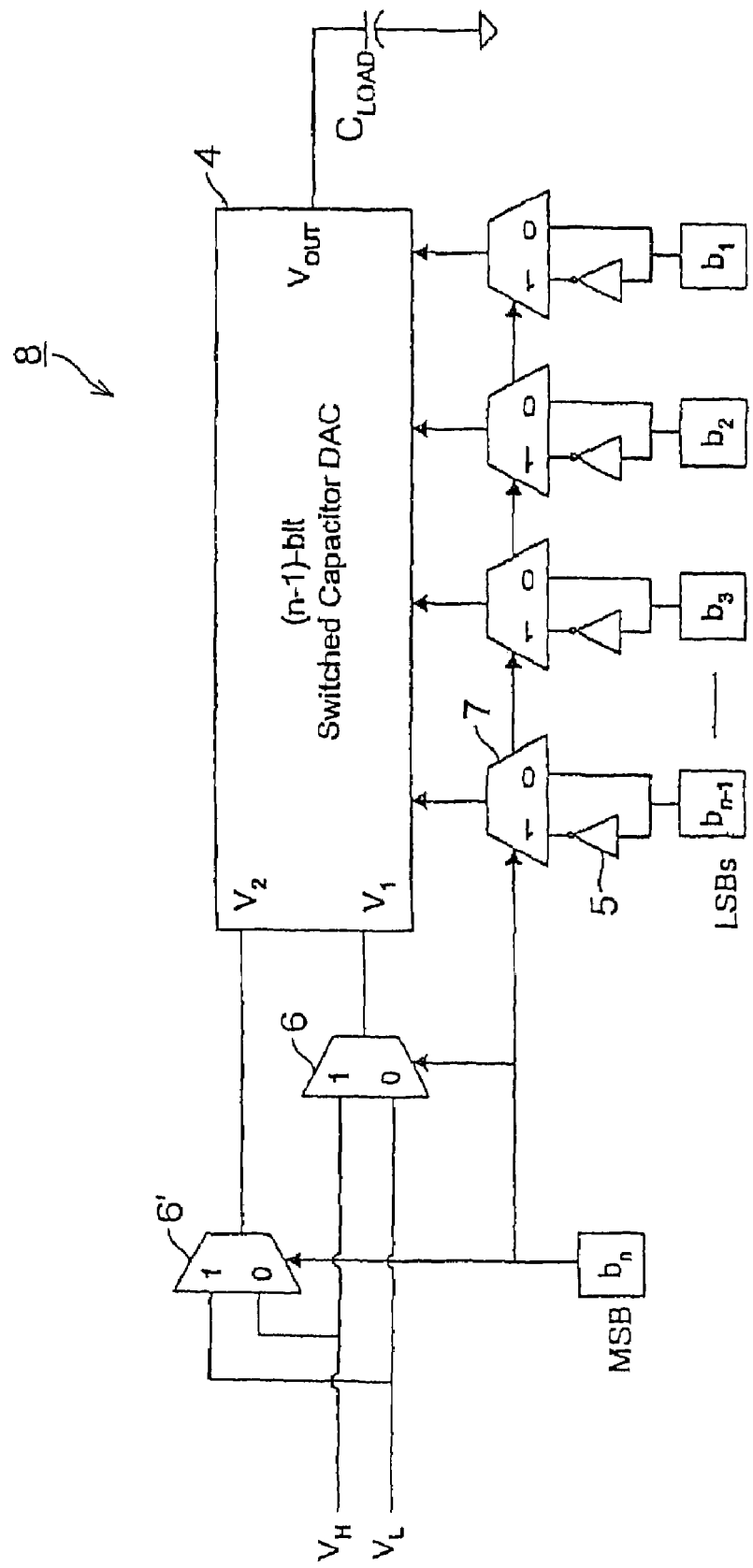
Figure 9: Prior Art

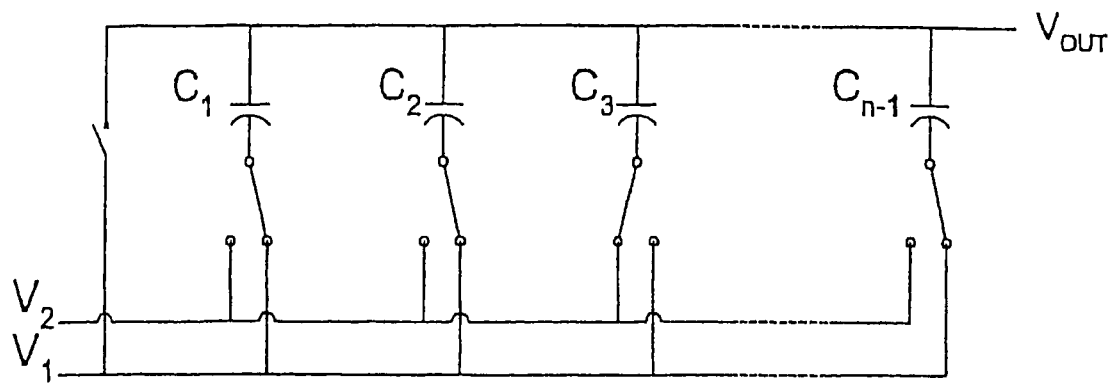
Figure 10: Prior Art
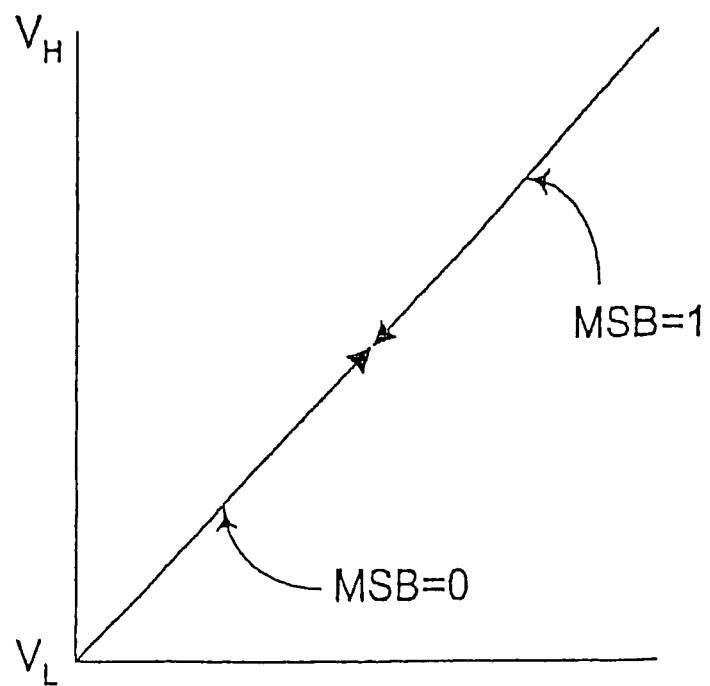
Figure 11: Prior Art

US 7,796,074 B2

DIGITAL/ANALOGUE CONVERTER, CONVERTER ARRANGEMENT AND DISPLAY

TECHNICAL FIELD

The present invention relates to a digital/analogue converter, in particular to a digital/analogue converter capable of directly driving a load capacitance without the need to provide a buffer amplifier between the converter and the load. Such a converter is known as a "bufferless" converter. Such a converter may be used, for example, for driving matrix columns of a liquid crystal display. A particular application of such a converter is in small display panels for portable applications where it is particularly desirable to minimise power consumption. The invention also relates to a converter arrangement including such a digital/analogue converter, to a display driver including such a digital/analogue converter, and to a display including such a driver.

BACKGROUND ART

FIG. 1 of the accompanying drawings illustrates a known type of switched capacitor digital/analogue converter (DAC) for converting an n-bit digital word (or n-bit digital "code") to a corresponding analogue output. The DAC comprises n-capacitors $C_1, \ldots, C_n$. The DAC further comprises a terminating capacitor $C_{TERM}$ connected between the input of a unity gain buffer 1 and ground. The first electrodes of the capacitors $C_1, \ldots, C_n$ are connected together and to the first terminal of the terminating capacitor $C_{TERM}$. The second electrode of each of the capacitors $C_1, \ldots, C_n$ is connected to a respective switch, such as 2, which selectively connects the second electrode to a first or second reference voltage input $V_1$ or $V_2$ in accordance with the state or value of a corresponding bit of the digital word. The output of the buffer 1 drives a capacitive load $C_{LOAD}$, for example in the form of a data line or column electrode of an active matrix of a liquid crystal device.

The DAC has two phases of operation, namely a resetting or "zeroing" phase and a converting or "decoding" phase, controlled by timing signals which are not illustrated in FIG. 1. During the zeroing phase, the first and second electrodes of the capacitors $C_1, \ldots, C_n$ and the first electrode of the terminating capacitor $C_{TERM}$ are connected together by an electronic switch 3 and to the first reference voltage input $V_1$. The capacitors $C_1, \ldots, C_n$ are therefore discharged so that the total charge stored in the DAC is equal to $V_1 C_{TERM}$.

During the decoding phase, the second electrode of each capacitor $C_i$ is connected to the first reference voltage input $V_1$ or to the second reference voltage input $V_2$ according to the value of the ith bit of the digital input word. The charge stored in the DAC is given by:

$$Q = \sum_i b_i C_i (V_{DAC} - V_2) + \sum_i (1 - b_i) C_i (V_{DAC} - V_1) + V_{DAC} C_{TERM} \quad (1)$$

where $b_i$ is the ith bit of the input digital word and $V_{DAC}$ is the voltage at the first electrodes of the capacitors $C_1, \ldots, C_n$ and $C_{TERM}$. The output voltage is therefore given by:

$$V_{DAC} = V_{OUT} = \frac{\sum_i b_i C_i}{\sum_i C_i + C_{TERM}} (V_2 - V_1) + V_1 \quad (2)$$

In general, $C_i = 2^{(i-1)} C_1$ and $C_1 = C_{TERM}$. This results in a set of output voltages which are linearly related to the input digital word.

In order to isolate the load capacitance from the DAC and to prevent it from affecting the conversion process, the unity gain buffer 1 is provided. However, such buffers are a substantial source of power consumption. If the buffer 1 were to be omitted, the terminating capacitance would be increased by the addition of the load capacitance so that the maximum output voltage from the DAC would be given by:

$$V_{OUT(MAX)} = \frac{\sum_i C_i}{\sum_i C_i + C_{TERM} + C_{LOAD}} (V_2 - V_1) + V_1 \quad (3)$$

The effect of this may be reduced by increasing the value of the switched capacitors. However, this increases the power consumption of and the area of an integrated circuit occupied by the DAC. In order to achieve voltages near to the higher reference voltage, such as that supplied to the reference voltage input $V_2$, the capacitances must be increased substantially.

Another technique for compensating for this effect is to increase the higher reference voltage supplied to the input $V_2$. However, this also increases the power consumption of the DAC and may also require more complex or powerful circuitry to generate the higher reference voltage.

In some applications, DACs are required to generate an output voltage as a non-linear function of the input digital word. For example, FIG. 2 illustrates the required transfer function of output voltage against the input digital code when a DAC is used as part of a driving arrangement for a liquid crystal display and FIG. 3 of the accompanying drawing illustrates how such a transfer function is modified in order to provide gamma correction.

DISCLOSURE OF INVENTION

A first aspect of the present invention provides a digital/analogue converter for converting an input n-bit digital code, where n is an integer greater than one, the digital/analogue converter having an n-bit digital input and an output for connection to a load, and comprising: an array of (n−1) switched capacitors; and a switching arrangement; wherein the switching arrangement is adapted, in a zeroing phase of operation, to connect a first reference voltage to the first plate of at least one capacitor of the array and to connect a second plate of the at least one capacitor to a voltage that, for at least one value of the input digital code, is different from the first reference voltage and is further adapted, in a decoding phase of operation, to enable, dependent on the value of the input digital code, injection of charge into the at least one capacitor. For example, the switching arrangement may be arranged such that, in the zeroing phase, the second plate of the ith capacitor is, for at least one combination of the most significant bit of the input code and the ith bit of the input code, connected to a voltage that is different from the first reference voltage.

In general charge will be injected into at least one capacitor during the decoding phase. However, the converter may be arranged so that the first reference voltage is the output voltage of the DAC for one or more values of the input code—in which case, no charge would be injected into any of the capacitors in the decoding phase when the input code has these values.

The converter may further comprise a first reference voltage input connectable to the first plate of each capacitor of the array; and second and third reference voltage inputs connectable to the second plate of each capacitor of the array; and the switching arrangement may be adapted, in the zeroing phase of operation, to connect the first, second and third reference voltage inputs to receive a respective one of first, second and third reference voltages, the second reference voltage being different from the third reference voltage, and is adapted to connect the second plate of each capacitor of the array to a respective one of the second and third reference voltage inputs.

The converter may comprise a plurality of switches, each switch connecting the second plate of an associated capacitor of the array to the second reference voltage input or to the third reference voltage input.

The switching arrangement may be adapted, in the decoding phase of operation, to isolate the first plate of each capacitor of the array from the first reference voltage and to connect the second plate of at least one capacitor of the array to the other of the second and third reference voltage inputs to which it was connected in the zeroing phase thereby to enable injection of charge into the capacitor.

The switching arrangement may be adapted to provide the first reference voltage as the output voltage for a pre-determined input code. The predetermined input code may be the mid-scale input code. The first reference voltage is the mid-scale output voltage, since the same DAC capacitors are used for upward movement of the output voltage during decoding as are used for downward movement of the output voltage during decoding. The first reference voltage is not, however, required to be the mean of the second reference voltage and third reference voltage (and the first reference voltage may not be between the second reference voltage and third reference voltage).

The switching arrangement may be adapted to connect, during the zeroing phase, the second plate of at least one capacitor to the second reference voltage input if the input code takes a first value or to the third reference voltage input if the input code takes a second value different from the first value. For example, the switching arrangement may be arranged such that, in the zeroing phase, the second plate of the ith capacitor is connected to the second reference voltage input for a first combination of the most significant bit of the input code and the ith bit of the input code, or is connected to the third reference voltage input for a second combination, different from the first combination, of the most significant bit of the input code and the ith bit of the input code.

The switching arrangement may be arranged to connect the second plate of the ith capacitor to one of the second and third reference voltages during the zeroing phase and to the other of the second and third reference voltages during the decoding phase if the ith bit of the input code takes the same value as the most significant bit of the input code thereby to inject charge into the ith capacitor.

The switching arrangement may be arranged to connect the second plate of the ith capacitor to one of the second and third reference voltages during the zeroing phase and to the same one of the second and third reference voltages during the decoding phase if the ith bit of the input code does not take the same value as the most significant bit of the input code.

The capacitance $C_i$ of the ith capacitor of the array may be given by: $C_i = a^{(i-1)} C_1$. The coefficient a may be a=2.

The sum of the capacitances of the capacitors of the array may be equal to the load capacitance.

One of the second and third reference voltages may be the minimum output voltage of the converter and the other of the second and third reference voltages may be the maximum output voltage of the converter.

One of the second and third reference voltages may be zero.

The converter may be a bufferless converter, and the output of the converter may be for direct connection to a capacitive load.

Alternatively, the output of the converter may be connectable via a buffer amplifier to a load. In this case, the load is not limited to a capacitive load but may be, for example, a resistive load.

A second aspect of the present invention provides a digital/analogue converter arrangement comprising: a digital/analogue converter of the first aspect; and a look-up table for converting an input m-bit digital code to an n-bit digital code and supplying the n-bit digital code to the digital/analogue converter.

A third aspect of the present invention provides a display driver comprising a converter of the first aspect.

A fourth aspect of the present invention provides a display driver comprising a converter arrangement of the second aspect.

A fifth aspect of the invention provides a display comprising a driver of the third or fourth aspect. The display may comprise a liquid crystal device.

BRIEF DESCRIPTION OF DRAWINGS

The invention will be further described, by way of example, with reference to the accompanying drawings, in which:

FIG. 6 is a circuit diagram of a further known DAC;

FIGS. 7 and 8 are graphs similar to FIG. 2 illustrating typical transfer functions of the DAC of FIG. 6;

FIG. 9 is a block circuit diagram of a known bi-directional DAC;

FIG. 10 is a simplified circuit diagram of part of the DAC of FIG. 9;

FIG. 11 is a graph illustrating the output range of the DAC of FIG. 9;

BEST MODE FOR CARRYING OUT THE INVENTION

Figure 1:
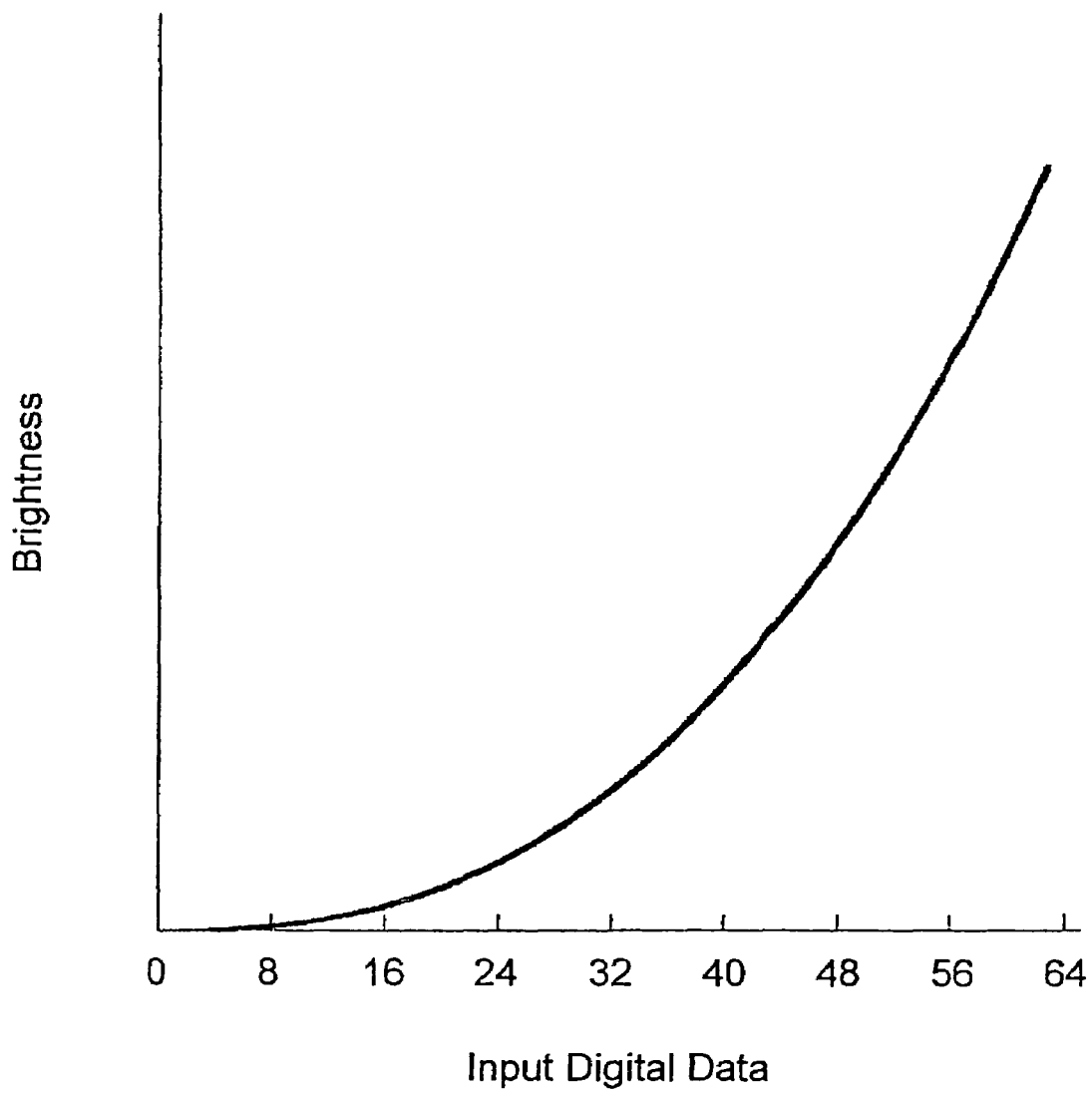
FIG. 1 is a simplified circuit diagram of a known DAC.
Figure 2:
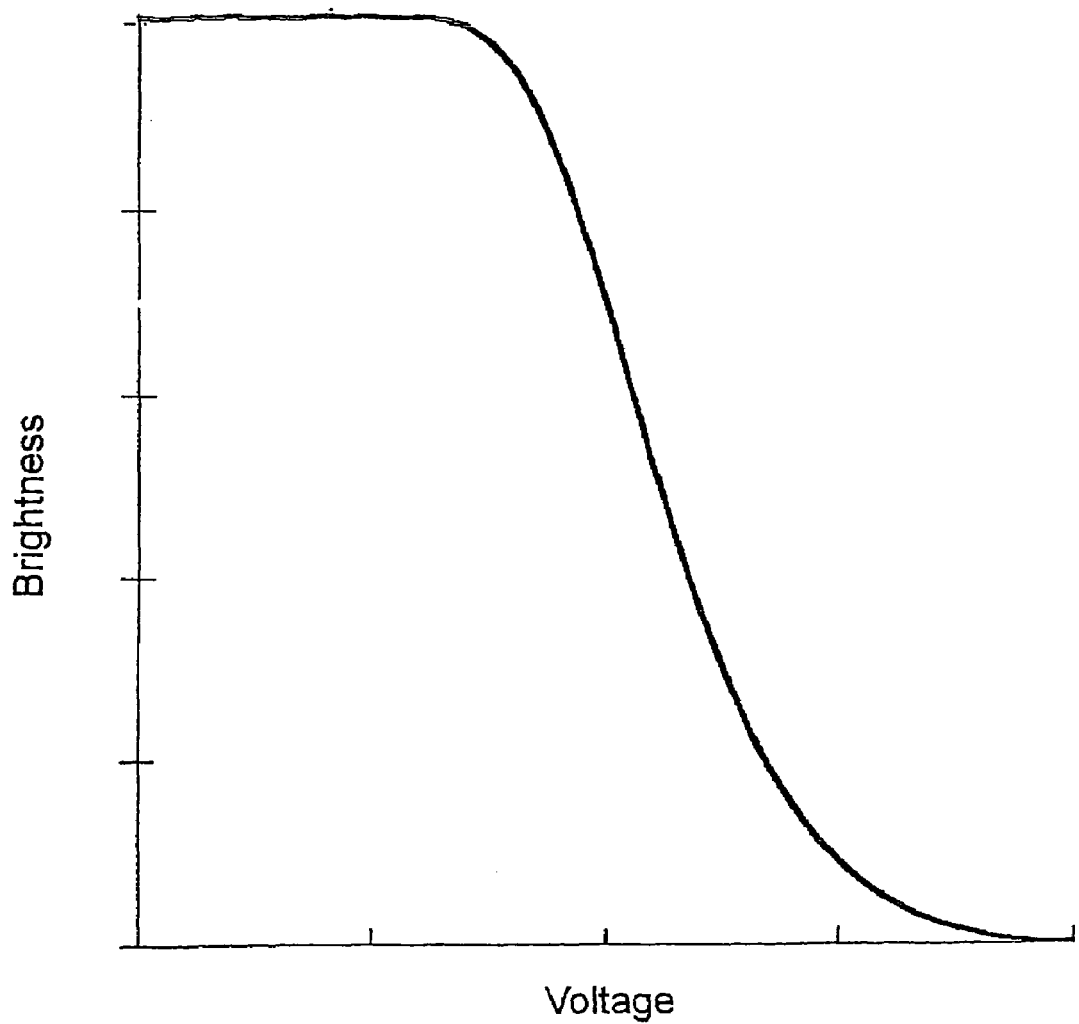
FIG. 2 is a graph of DAC output voltage against input digital code illustrating a required transfer characteristic for driving a typical liquid crystal display.
Figure 3:
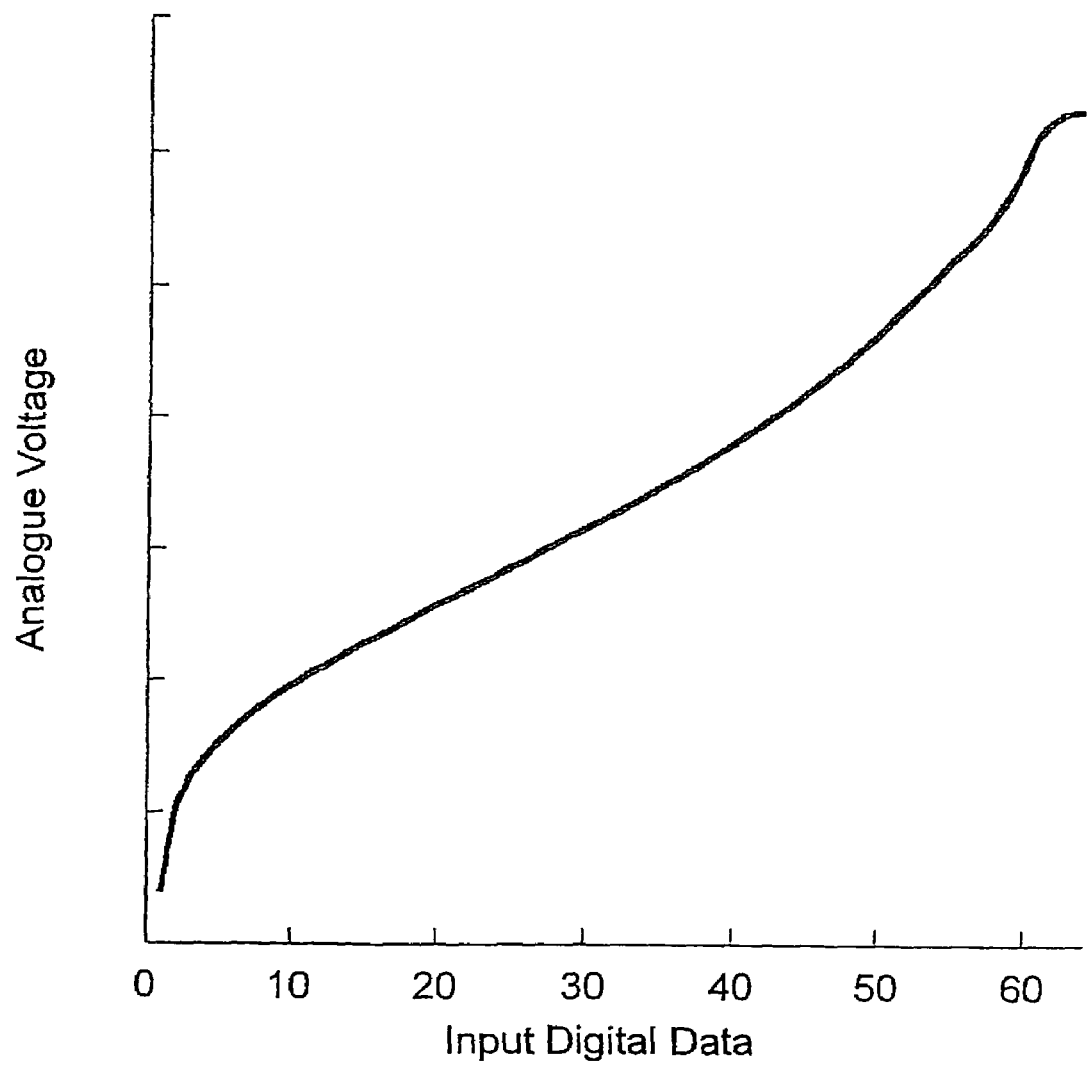
FIG. 3 is similar to FIG. 2 but illustrates the use of gamma correction with a gamma value of 2.2.
Figure 12:
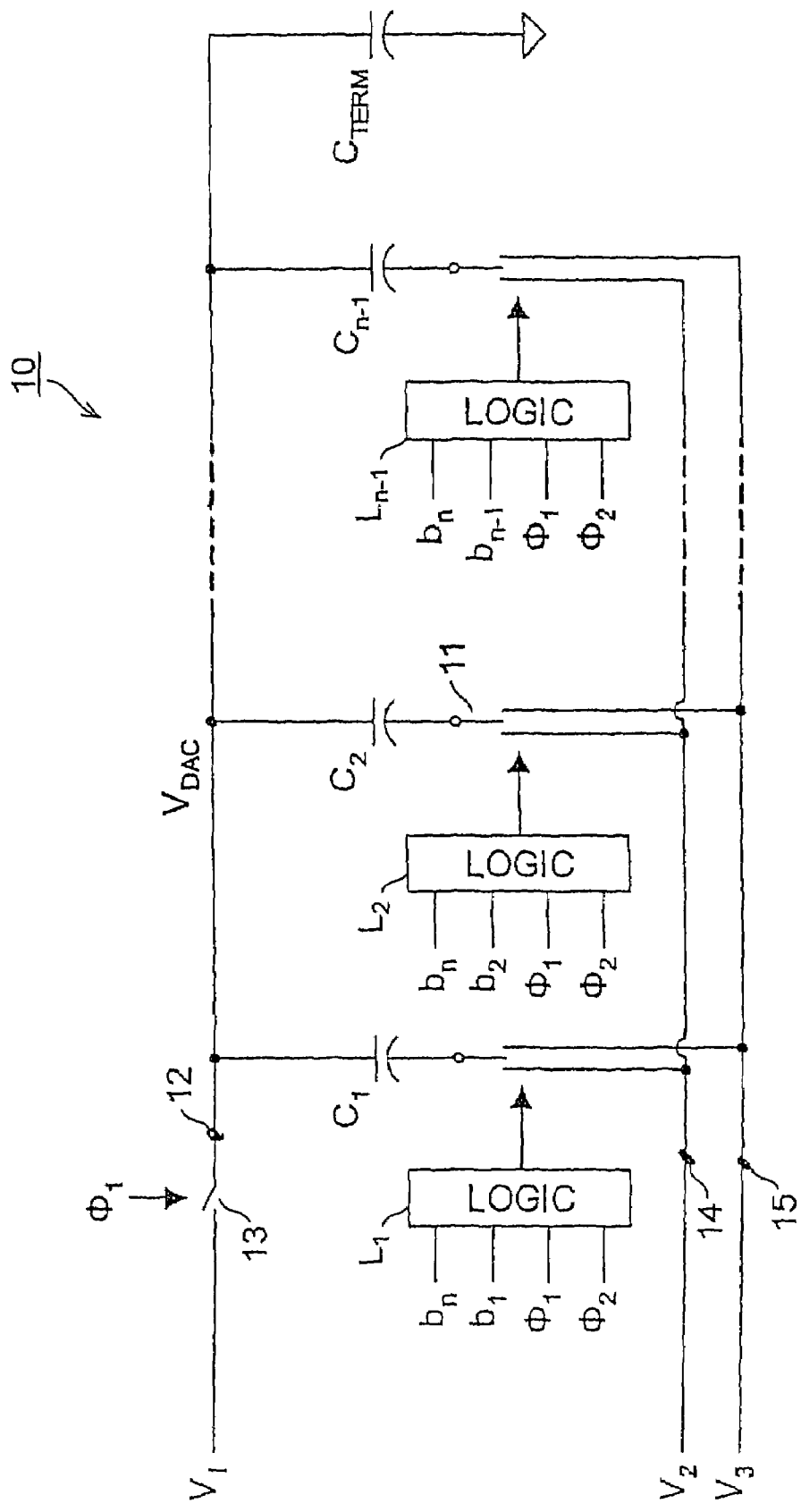
FIG. 12 is a block circuit diagram of a DAC according to an embodiment of the invention.

FIG. 12 is a block circuit diagram of a digital/analogue converter 10 according to a first embodiment of the present invention. The DAC of FIG. 12 is for converting an input n-bit digital code into an output voltage. In this embodiment the DAC is a "bufferless" DAC, and the output is suitable for connection direct to a load capacitance, shown in FIG. 12 as $C_{term}$. By the term "bufferless DAC" as used herein is meant a DAC in which the output buffer 1 having unity gain of FIG. 1 is not required to be present.

If the DAC of FIG. 12 is incorporated in a display driver for driving a display device the load capacitance may, for example, comprise a data line of an active matrix liquid crystal device.

The n-bit DAC of FIG. 12 comprises an array of (n−1) capacitors $C_1, C_2 \ldots C_{n-1}$, each capacitor being connected to a respective switch 11 controlled by two timing signals $\phi_1, \phi_2$ and the ith bit $b_i$ and the most significant bit $b_n$ of an n-bit input digital code b.

One plate of each capacitor $C_i$ of the DAC (for consistency with FIG. 12 this plate will be referred to as the "upper plate", although this wording is used purely for convenience and does not limit the DAC to any specific orientation in use) is connected to a first reference voltage input 12. The first reference voltage input 12 may be connected to a first reference voltage source $V_1$ by means of a switch 13 controlled by the first timing signal $\phi_1$.

The other ("lower") plate of each capacitor $C_i$ of the DAC is connectable by a respective one of the switches 11 to either a second reference voltage input 14 or a third reference voltage input 15. The second and third reference voltage inputs 14, 15 are connectable, in use, to sources of second and third reference voltages $V_2, V_3$ respectively. The second reference voltage $V_2$ is different from the third reference voltage $V_3$.

The switches 11 associated with the lower plates of the capacitors $C_i$ are controlled by the outputs from respective logic circuits $L_1, L_2 \ldots L_{n-1}$. Each logic circuit $L_i$ receives as inputs the two timing signals $\phi_1, \phi_2$, and the ith bit $b_i$ and the most significant bit $b_n$ of the n-bit input digital code. That is, although the array of capacitors in the DAC has only (n−1) capacitors $C_1, C_2 \ldots C_{n-1}$ the DAC has an n-bit input, since the most significant bit $b_n$ of the input code is input to each logic circuit $L_i$.

The DAC of FIG. 12 operates in a zeroing phase followed by a decoding phase. In the zeroing phase, the switch 13 is closed by the first timing signal $\phi_1$, so that the upper plate of each capacitor $C_i$ of the DAC, and the upper plate of the load capacitor $C_{term}$ are held at the potential of the first reference voltage $V_1$. Since the top plates of the DAC capacitors $C_i$ and of the load capacitor $C_{term}$ are charged to the first reference voltage $V_1$, the output voltage of the DAC, $V_{DAC}$, is charged to the first reference voltage $V_1$.

In the decoding phase, the switch 13 is opened by the first timing signal $\phi_1$, so that the first reference voltage input 12 is isolated from the first reference voltage source $V_1$. The output voltage $V_{DAC}$ floats to a voltage that is dependent upon the input code.

The connection of the lower plate of each capacitor $C_i$ of the DAC 10 during the zeroing phases and the decoding phase is dependent on the respective bit $b_i$ of the input data code, and on the most significant bit (MSB), $b_n$, of the input data code. There are essentially two possibilities for the connection of the lower plate of each capacitor $C_i$—either (a) the voltage applied to the lower plate of the capacitor $C_i$ during the decoding phase is different from the voltage that was applied to the lower plate of the capacitor $C_i$ during the zeroing phase, so that charge is injected across the ith capacitor $C_i$ in the decoding phase or (b) the voltage applied to the lower plate of the capacitor $C_i$ during the decoding phase is the same as the voltage that was applied to the lower plate of the capacitor $C_i$ during the zeroing phase, so that no charge is injected across the ith capacitor $C_i$ in the decoding phase.

If charge is injected across the ith capacitor $C_i$, the sign of the injected charge is preferably determined by the most significant bit $b_n$ of the input data code.

In the embodiment of FIG. 12, in which the lower plate of the ith capacitor $C_i$ may be connected to either the second reference voltage $V_2$ or to the third reference voltage $V_3$, option (a) above may be implemented by controlling the switch 11 associated with the ith capacitor $C_i$ to connect the lower plate to the second reference voltage $V_2$ in the zeroing phase and to the third reference voltage $V_3$ in the decoding phase, or by controlling the switch 11 associated with the ith capacitor $C_i$ to connect the lower plate to the third reference voltage $V_3$ in the zeroing phase and to the second reference voltage $V_2$ in the decoding phase. Option (b) may be implemented by connecting the lower plate of the ith capacitor $C_i$ to the second reference voltage $V_2$ for the duration of both the zeroing and decoding phases or by connecting the lower plate of the ith capacitor $C_i$ to the third reference voltage $V_3$ for the duration of both the zeroing and decoding phases.

In a preferred embodiment, the switching arrangement of the DAC of FIG. 12 operates as follows:

If the most significant bit (MSB) and the ith bit of the input code are both logic zero ($b_n=0, b_i=0$), the switch 11 connects the lower plate of the capacitor $C_i$ to the third reference voltage $V_3$ in the zeroing phase, and connects the lower plate of the capacitor $C_i$ to the second reference voltage $V_2$ in the decoding phase. The voltage applied to the lower plate of the capacitor $C_i$ thus changes between the zeroing phase ($V_3$) and the decoding phase ($V_2$) so that charge is injected across the capacitor $C_i$. The injected charge is given by $Q_i=(V_2-V_3)C_i$.

If the MSB and the ith bit of the input code are both logic one ($b_n=1, b_i=1$), the switch 11 connects the lower plate of the capacitor $C_i$ to the second reference voltage $V_2$ in the zeroing phase, and connects the lower plate of the capacitor $C_i$ to the third reference voltage $V_3$ in the decoding phase. Charge is again injected across the capacitor $C_i$, and the injected charge is given by $Q_i=(V_3-V_2)C_i$.

It will be seen that the sign of charge injected across the ith capacitor when $b_n=1, b_i=1$ is opposite to the sign of charge injected when $b_n=0, b_i=0$.

If the MSB of the input code has a different logic state to the ith bit of the input code ($b_n \neq b_i$), the connection of the lower plate of the capacitor $C_i$ remains unchanged between the zeroing phase and the decoding phase. No charge is therefore injected across the capacitor $C_i$. If the lower plate was connected to the second reference voltage source during the zeroing phase it remains connected to the second reference voltage source during the decoding phase and, similarly, if the lower plate is connected to the third reference voltage source during the zeroing phase it remains connected to the third reference voltage source during the decoding phase. (Whether the lower plate is connected to the second reference voltage $V_2$ or to the third reference voltage $V_3$ is a matter of design choice, and will be determined by the particular form of the logic circuits $L_i$ and the switches 11.)

In the following description it will be assumed, for the purpose of explanation, that the second reference voltage $V_2$ is less than the third reference voltage $V_3$.

At the end of the zeroing phase, the DAC output voltage was charged to $V_1$, as explained above. In the decoding phase, the upper plates of the capacitors $C_i$ and the load capacitor $C_{term}$ are disconnected from the first reference voltage source, and charge is injected across at least some of the DAC capacitors as described above (with the exception that if the input code is 100 . . . 00 or 011 . . . 11 no charge is injected since $b_n \neq b_i$ for all values of $i \neq n$). As a result of the injection of charge, the DAC output voltage floats to a voltage that is determined by the input digital code, as follows:

$b_n = 0$:

$$V_{DAC} = V_1 - \frac{\sum_{1}^{n-1}(1-b_i)C_i}{\sum_{1}^{n-1} C_i + C_{TERM}}(V_3 - V_2) \quad (5)$$

$b_n = 1$:

$$V_{DAC} = V_1 + \frac{\sum_{1}^{n-1} b_i C_i}{\sum_{1}^{n-1} C_i + C_{TERM}}(V_3 - V_2) \quad (6)$$

Figure 14:
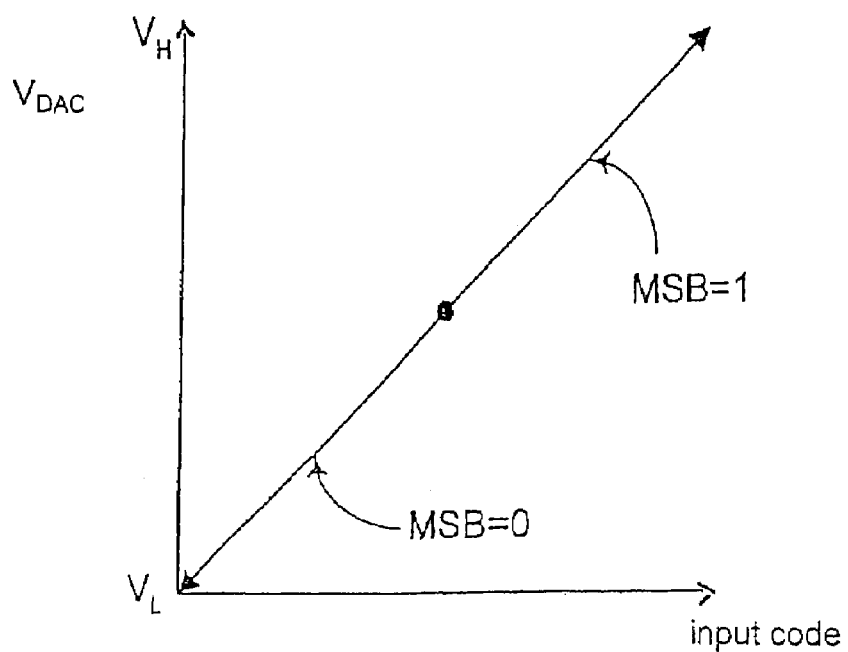
FIG. 14 is a graph illustrating the output range of the DAC of FIG. 12.

FIG. 14 shows the output characteristic of the DAC of FIG. 12. Input codes of 011 . . . 111 and 100 . . . 00 each produce an output voltage of $V_1$, since no charge is injected in the decoding phase for either of these input codes. As the input code increases above 100 . . . 00 the DAC output voltage increases from $V_1$ to a maximum output voltage $V_H$. Similarly, as the input code decreases from 011 . . . 111, the DAC output voltage decreases from $V_1$ to a minimum output voltage $V_L$. If the sum of the DAC capacitances is equal to the load capacitance (that is, if $\Sigma C_i = C_{TERM}$), the maximum and minimum voltages are given by $V_H = V_1 + \frac{1}{2}(V_3 - V_2)$, and the minimum output voltage is given by $V_L = V_1 - \frac{1}{2}(V_3 - V_2)$.

The output characteristic of FIG. 14 again contains two "arms". However, the two arms start at the mid level of the output voltage, and move away from the mid-level voltage. This is in contrast to the prior art output characteristic of FIG. 11, in which the two arms of the characteristic converge at a common point.

As a result, the output characteristic of the present invention does not suffer from a mis-match at the point where the two arms meet in the event that the load capacitance is not correctly matched to the internal capacitance of the DAC. Any errors in the output characteristic arising as the result of a mis-match between the load capacitance and the internal capacitance of the DAC will occur at the ends of the arms, for output voltages close to the minimum output voltage $V_L$ or for output voltages close to the maximum output voltage $V_H$. In the case where the DAC is driving pixels of a display, this means that errors in the output characteristic will affect the near-black and near-white tones—and, as mentioned above, the human eye is less sensitive to errors at the black or white ends of the grey-scale. The output characteristic of FIG. 14 ensures good matching of the two arms where they meet at the midpoint of the characteristic so that, when a DAC of the invention is used to drive pixels in a display, the mid-grey tones will be correctly reproduced leading to improved display quality.

The required accuracy of the matching between the internal DAC capacitance and the load capacitance is therefore reduced.

A further example is that the DAC does not have to dominate the load capacitance. This means that the area occupied by the DAC, and the power consumed by the DAC, may both be reduced. At the same time, the speed of operation of the DAC is increased. In the prior art DAC of FIG. 1, in contrast, the lowest DAC capacitor typically has a capacitance that is equal to the load capacitance and higher DAC capacitors have capacitances that are much higher than the load capacitance. This makes it hard to reduce the area of the prior art DAC.

The DAC of the present invention also shares many of the advantages of the DAC of FIG. 9. The DAC of the invention can be used without an output buffer amplifier. This allows a DAC of the invention to have a low power consumption, since the buffer amplifier is a major source of power consumption in the DAC of FIG. 1.

A DAC of the invention can be arranged to have a linear output or a non-linear output. A DAC with a linear output can be used to model any desired output, by using a DAC of higher resolution in connection with a look-up table, as described in relation to the prior art DAC of FIG. 1 above.

The output voltage range of a DAC of the invention is, as can be seen from equations (5) and (6) above, given by $$\text{Output Voltage Range} = 2\frac{\sum_{1}^{n-1} C_i}{\sum_{1}^{n-1} C_i + C_{TERM}}|V_3 - V_2| \quad (7)$$

Figure 4:
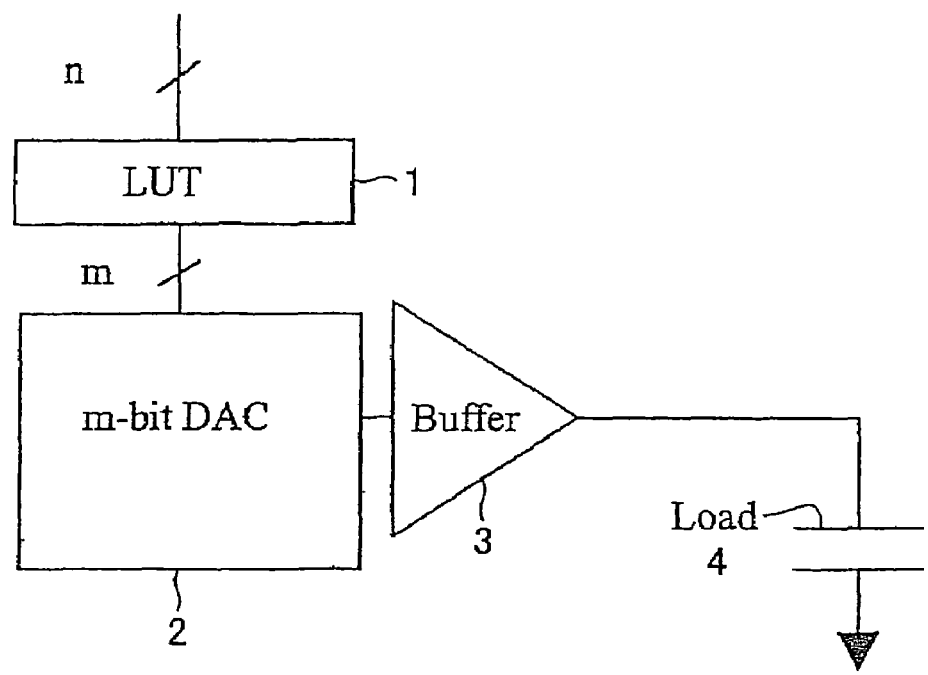
FIG. 4 is a simplified circuit diagram of another known DAC.
Figure 5:
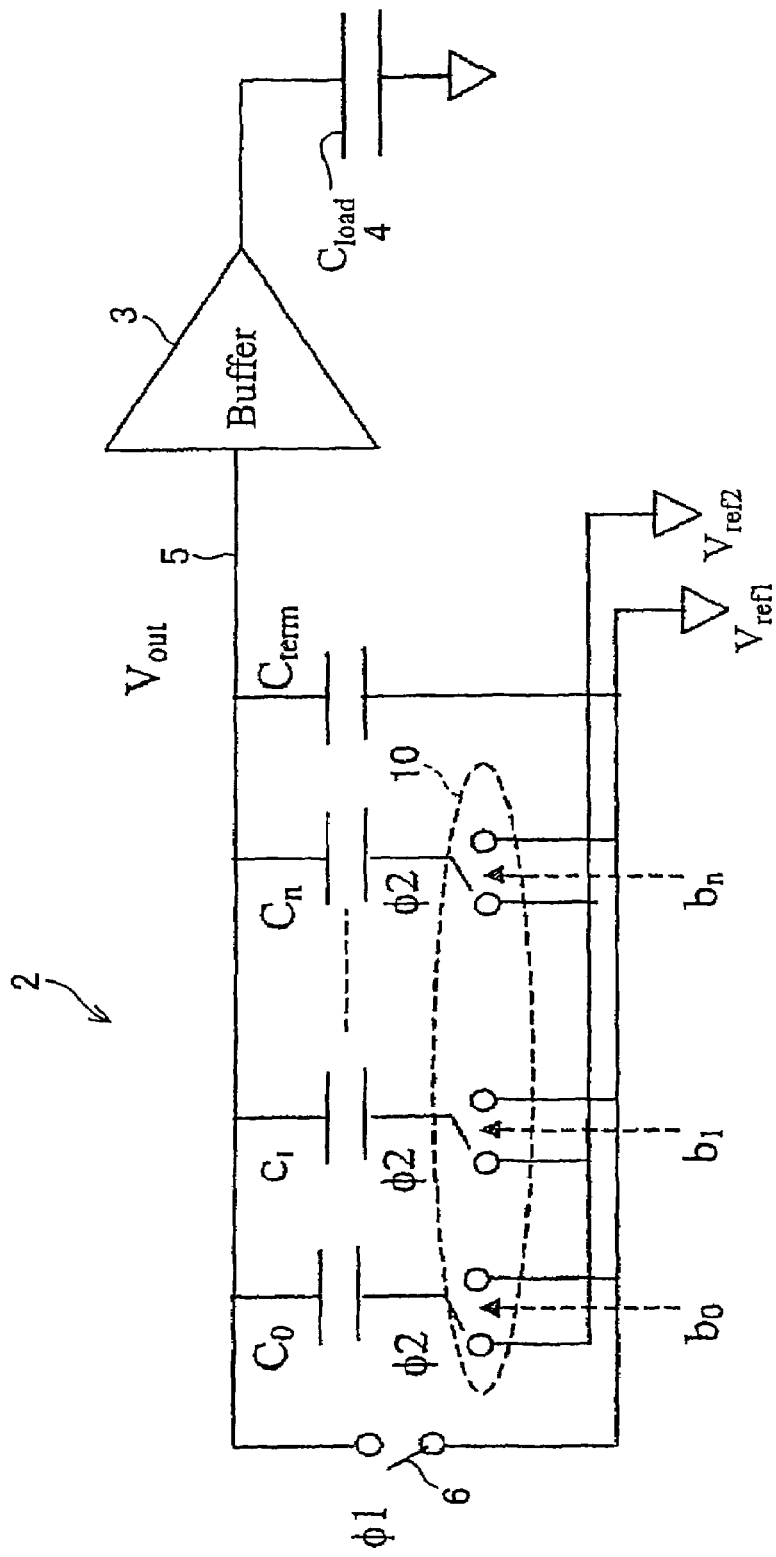
FIG. 5 is a graph similar to FIG. 2 but illustrating the rotational symmetry of the transfer function of the DAC of FIG. 4.

In a simple implementation, $\Sigma C_i = C_{load}$ and $V_2$ and $V_3$ then correspond to the minimum and maximum output voltages—so that any desired minimum and maximum output voltages can be obtained by appropriate choice of $V_2$ and $V_3$. In this implementation, the second and third reference voltages $V_2$ and $V_3$ are as simple as possible to generate, and the power consumed in generating the second and third reference voltages $V_2$, $V_3$ is reduced compared to the power required to generate reference voltages in the prior art bufferless converter of FIG. 4.

In this implementation, the reference voltages $V_2$, $V_3$ can also be used to give a simple three-output DAC, for example for use in a low-power mode where the DAC is disabled.

In an alternative implementation, the absolute difference between $V_3$ and $V_2$, $|V_3 - V_2|$, may be made greater than the required output voltage range. As shown by equation (7), this makes it possible to reduce $\Sigma C_i$ below $C_{load}$, and this makes possible a further reduction in the size of the DAC.

In a preferred embodiment, one of the second and third reference voltages $V_2$, $V_3$ may be set to zero, and this further simplifies generation of the reference voltages.

As with the DAC of FIG. 9, the internal capacitance of a DAC of the invention may be "tuned" during the design and manufacturing process to suit a particular intended use of the DAC. The DAC may also be "re-tuned" after manufacture to allow it to operate with a variety of load capacitances, for example in the manner described in co-pending UK patent application No 0423397.9 (although this would require comparing the output of one or more DACs with a reference voltage rather than comparing the outputs of one DAC with the output of another DAC as described in UK patent application No 0423397.9.

FIG. 14 shows the output voltage characteristic of the DAC of FIG. 12 for the case where the second and third reference voltages $V_2$, $V_3$ are set to the upper and lower limits of the required output voltage range. That is, the second reference voltage $V_2=V_L$, and the third reference voltage $V_3=V_H$, where $V_L$ and $V_H$ are the upper and lower required voltage limits of the voltage characteristic. In this case, as explained above, the DAC capacitances are arranged such that $\Sigma C_i=C_{load}$.

In a preferred embodiment, the DAC capacitors may be weighted, so that $C_i=a^{(i-1)}C_1$. In a particularly preferred embodiment a=2 so that the DAC capacitors are binary weighted. In this case, the output voltage characteristic of the DAC is linear, as shown in FIG. 14.

Figure 13:
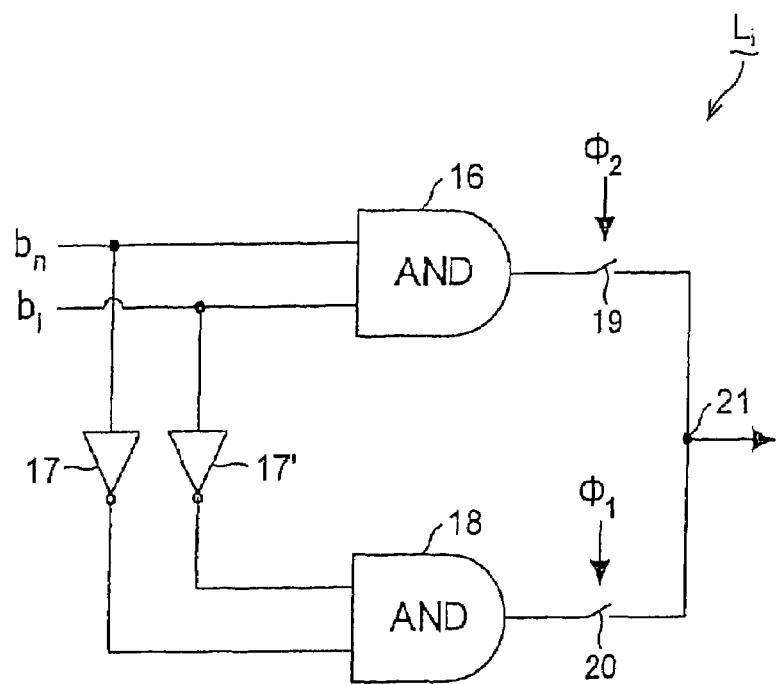
FIG. 13 is a block circuit diagram of part of the DAC of FIG. 12.

FIG. 13 shows one possible implementation of a logic circuit $L_i$ of the DAC of FIG. 12. In this embodiment of the logic circuit $L_i$, the most significant bit of an input data code $b_n$ and the ith bit of the input data code, $b_i$, are input to an AND gate 16. The MSB and the ith bit, $b_n$ and $b_i$, are also input via inverters 17, 17' to a second AND gate 18. The outputs of the two AND gates are passed to the output 21 of the logic circuit $L_i$, via respective switches 19, 20.

The switch 20 that selects the output of the second AND gate 18 is controlled by the first timing signal $\phi_1$. This takes a logic one value in the zeroing phase, and a logic zero value in the decoding phase, so that the switch 20 is closed in the zeroing phase and is open in the decoding phase. The switch 19 that selects the output of the first AND gate 16 is controlled by a second timing signal $\phi_2$ which takes a logic zero value during the zeroing phase and takes a logic one value in the decoding phase. Thus, in the zeroing phase the output from the second AND gate 18 is selected and in the decoding phase the output from the first AND gate 16 is selected.

The output from the logic circuit $L_{i,n}$ controls the switch 11 that connects the lower plate of the capacitor $C_i$ to either the second reference voltage $V_2$ or the third reference voltage $V_3$. In FIG. 13, during the zeroing phase the switch 11 is controlled by the value of $(!b_i \cdot !b_n)$, and during the decoding phase, the switch 11 is controlled by the value of $(b_i \cdot b_n)$. Thus, if $b_i=b_n$, the logic circuit $L_i$ of FIG. 13 is effective to connect the lower plate of the capacitor $C_i$ to one of the second and third reference voltages $V_2$, $V_3$ during the zeroing phase and to the other of the second and third reference voltages $V_2$, $V_3$ during the decoding phase. If $b_i \neq b_n$, each AND gate 16, 18 will always give a logic zero output, so that the lower plate of the capacitor $C_i$ will be connected to the same one of the second and third reference voltages $V_2$, $V_3$ in both the zeroing phase and the decoding phase, so that no charge is injected across the capacitor $C_i$.

In the embodiment of FIG. 12, it is assumed that the switch 11 connects the lower plate of the capacitor $C_i$ to the second reference voltage $V_2$ if the logic circuit $L_i$ outputs logic value 0, and connects the lower plate of the capacitor $C_i$ to the third reference voltage $V_3$ if the logic circuit $L_i$ outputs a logic value 1.

Figure 15:
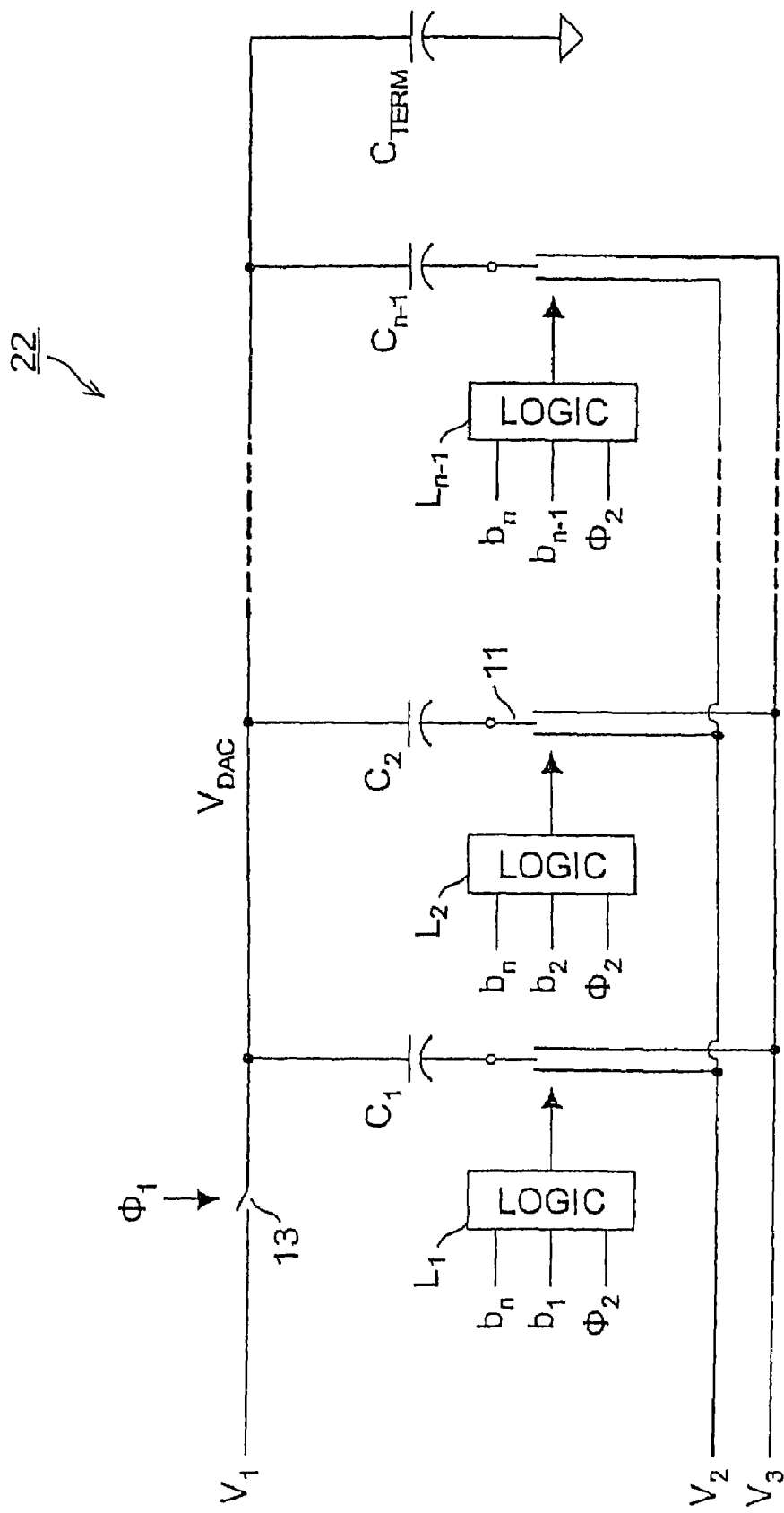
FIG. 15 is a block circuit diagram of a DAC according to a second embodiment of the invention.

FIG. 15 shows a DAC 22 according to a second embodiment of the present invention. The DAC 22 of FIG. 15 corresponds generally to the DAC 10 of FIG. 12, and the description of features common to both embodiments will not be repeated. The DAC 22 of FIG. 15 differs from the DAC 10 of FIG. 12 essentially in the form of the logic circuits $L_i$. As shown in FIG. 15, the logic circuits $L_i$ of FIG. 15 are controlled by only one of the timing signals.

Figure 16:
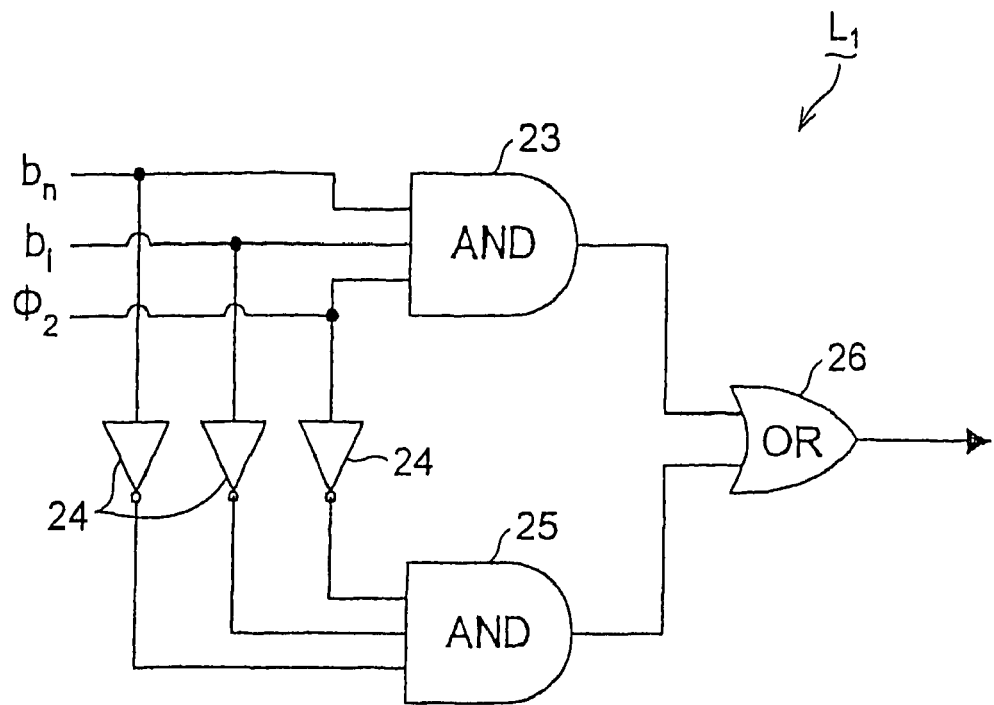
FIG. 16 is a block circuit diagram of part of the DAC of FIG. 15.

The logic circuit $L_i$ of the DAC 22 of FIG. 15 is shown in FIG. 16. As shown in FIG. 16, the input to the logic circuit $L_i$ are the MSB ($b_n$) of the input data code, the ith bit of the input data code ($b_i$), and the second timing signal $\phi_2$ (which is logic zero during the zeroing phase and logic one during the decoding phase). The MSB of the input data code, the ith bit of the input data code, and the second timing signal $\phi_2$ are input to a first AND gate 23, and are also input via inverters 24 to a second AND gate 25. The outputs of the first and second AND gates 23, 25 are input to an OR gate 26. The switch 11 is controlled by the output from the OR gate 26.

It can be seen that if the input data code has $b_n=b_i=1$, the logic circuit $L_i$ will produce an output of logic zero in the zeroing phase, since the input bits to the logic circuit $L_i$ will be (1,1,0) so that both AND gates will give an output of logic zero. In the decoding phase, however, the timing signal $\phi_2$ will have a value of logic one, so that the input bits to the logic circuit $L_i$ will be (1, 1, 1) and the first AND gate 23 will provide an output of logic 1. The logic circuit $L_i$ will thus produce an output of logic one in the decoding phase.

Conversely, if the input data code has $b_n=b_i=0$, the second AND gate 25 will produce an output of logic one in the zeroing phase, and both AND gates 23,25 will produce an output of logic zero in the decoding phase. The logic circuit $L_i$ will thus produce an output of logic one in the zeroing phase and logic zero in the decoding phase. In both the cases $b_n=b_i=1$ and $b_n=b_i=0$, therefore, the switch 11 connects the capacitor $C_i$ to one of the second and third voltage sources in the zeroing phase and to the other of the second and third reference voltages $V_2$, $V_3$ in the decoding phase. (In the embodiment of FIGS. 15 and 16 the switch 11 is controlled to connect the lower plate of the capacitor $C_i$ to the second reference voltage $V_2$ if the output from the OR gate 26 is logic zero, and to connect the lower plate of the capacitor $C_i$ to the third reference voltage $V_3$ if the output of the OR gate 26 is logic one.)

For any bit of the input data code for which $b_i \neq b_n$, the logic circuit $L_i$ will output logic zero in both the zeroing and decoding phases. No charge will therefore be injected across the capacitor $C_i$.

More formally, the output of the logic circuit $L_i$ of FIG. 16 is given by $(b_i \cdot b_n \cdot \phi_2)+(!b_i \cdot !b_n \cdot !\phi_2)$. In the embodiment of FIG. 15 the switch 11 connects the lower plate of the ith capacitor to the second reference voltage $V_2$ if $(b_i \cdot b_n \cdot \phi_2)+(!b_i \cdot !b_n \cdot !\phi_2) =0$ and connects the lower plate of the ith capacitor to the third reference voltage $V_3$ if the output of the logic circuit $L_i$ is logic one.

The logic circuits $L_i$ of a DAC of the present invention are not limited to the two examples shown in FIGS. 13 and 16. In principle, any logic circuit that satisfied the following requirements may be used:

if $b_i=b_n=1$: output logic zero (or logic one) in the zeroing phase and logic one (or logic zero) in the decoding phase;

if $b_i=b_n=0$: output logic one (or logic zero) in the zeroing phase and logic zero (or logic one) in the decoding phase; and if $b_i \neq b_n$, output the same logic value in both the zeroing phase and the decoding phase.

As explained above, the second and third reference voltages $V_2$, $V_3$ in the embodiments of FIG. 12 or 15 are not required to be the upper and lower limits of the required output voltage range of the DAC (that is, $V_L$ and $V_H$). As an example, one of the second and third reference voltages $V_2$, $V_3$ may be set as the ground (zero) voltage, thereby simplifying the circuits required to provide the reference voltages.

As a further alternative, the second and third reference voltages $V_2$, $V_3$ may be set either further apart or closer together, so that $|V_3-V_2|$ may be greater than or less than $V_H-V_L$. The required voltage output range is then obtained by choosing the sum of the DAC capacitances ($\Sigma C_i$) accordingly, according to equation (3). For example, if the second and third reference voltages $V_2, V_3$ are set further apart, the sum of the DAC capacitances may be reduced, thereby reducing the area required for the DAC. Alternatively, if the second and third reference voltages $V_2, V_3$ are set close together, the power consumption of the DAC will be reduced (in order to provide a specified output voltage range, the sum of the DAC capacitances must be increased, the power stored in a capacitor is proportional to $CV^2$, but in a DAC the capacitance C is proportional to $V^{-1}$).

As mentioned above, the capacitors $C_i$ of the DAC may be binary-weighted, or weighted according to $C_i=a^{(i-1)}C_1$. The invention is not, however, limited to this, and the DAC capacitors may have any suitable weighting. For example, the DAC capacitors may be weighted such that the capacitances of the DAC capacitors are not uniform multiples of one another, or such that all DAC capacitors have the same capacitance (known as "thermometer coding").

Figure 17:
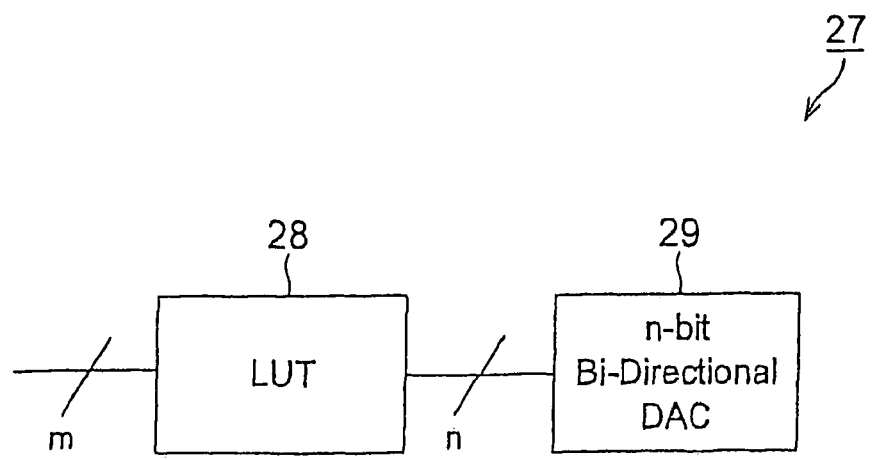
FIG. 17 is a block circuit diagram of a DAC arrangement according to a further embodiment of the invention.

FIG. 17 shows a DAC arrangement 27 that incorporates a bi-directional DAC of the present invention. The DAC arrangement 27 comprises a look-up table 28 having an m-bit input and an n-bit output; the output from the look-up tables 28 is input to an n-bit bi-directional DAC 29 of the present invention. The DAC 29 of FIG. 17 may be, for example, the DAC 10 of FIG. 12 or the DAC 22 of FIG. 15. The look-up table 28 maps an m-bit digital input code to an n-bit code which is input to the n-bit DAC 29. The DAC arrangement 27 of FIG. 17 may be implemented in one of three ways:

m<n. This would allow a selection from the range of possible output voltages of the DAC 29 to be used. This would commonly be used in order to obtain a non-linear output voltage characteristic from a linear DAC.

m=n. In this case, the look-up table would re-order and/or combine some input codes.

m>n. In this case, use of the look-up table would allow the use of a low resolution DAC in a higher resolution system (although with a loss of resolution).

The invention has been described above on the assumption that the first, second and third reference voltages are all different from one another, i.e. on the assumption that $V_1 \neq V_2$, $V_2 \neq V_3$ and $V_1 \neq V_3$. This is not necessary, however, and it is possible for the first reference voltage $V_1$ to be equal to one of the second and third reference voltages $V_2, V_3$. Making the first reference voltage $V_1$ equal to one of the second and third reference voltages $V_2, V_3$ simplifies generation of the reference voltages, as only two non-zero reference voltages must be generated. Moreover, making the first reference voltage $V_1$ and one of the second or third reference voltages $V_2, V_3$ equal to zero (ground) further simplifies generation of the reference voltages since it is required to generate only one non-zero reference voltage.

A DAC required to output a voltage that could be either positive or negative may have the first reference voltage $V_1$ and one of the second or third reference voltages $V_2, V_3$ set to zero (ground). As an example, consider the preferred embodiment described above for operation of the DAC of FIG. 12 with the first and second reference voltages $V_1, V_2$ set to zero, $V_1=V_2=0$, and the third reference voltage $V_3$ set to a positive voltage. In this case, if the MSB $b_n$ and the ith bit $b_i$ of the input code were both equal to logic one ($b_n=b_i=1$), the upper and lower plates of the ith capacitor would both be connected to zero potential during the zeroing phase, as both the first reference voltage $V_1$ (applied to the upper plate) and the second reference voltage $V_2$ (applied to the lower plate) are zero, so that the same voltage would applied to both plates of the ith capacitor. However, if the MSB $b_n$ and the ith bit $b_i$ of the input code were both equal to logic zero ($b_n=b_i=0$), during the zeroing phase, the upper plate of the ith capacitor would be connected to zero potential and the lower plate of the ith capacitor would be connected to the third reference voltage $V_3$—so that the two plates of the ith capacitor would be connected to different voltages during the zeroing phase. The change in potential of the lower plate of the ith capacitor would be as previously described, and the output voltages would be as given by equations (5) and (6) but with $V_1=V_2=0$.

The embodiments of FIGS. 12 to 17 relate to a digital/analogue converter comprising a bufferless switched capacitor digital/analogue converter having an output for direct connection to a capacitive load. The invention is not however limited to this and may in principle be applied to a digital/analogue converter in which the output is connected to a load via a buffer amplifier; in such an embodiment the load is not limited to a capacitive load, and the load may be, for example, a resistive load.

Figure 18:
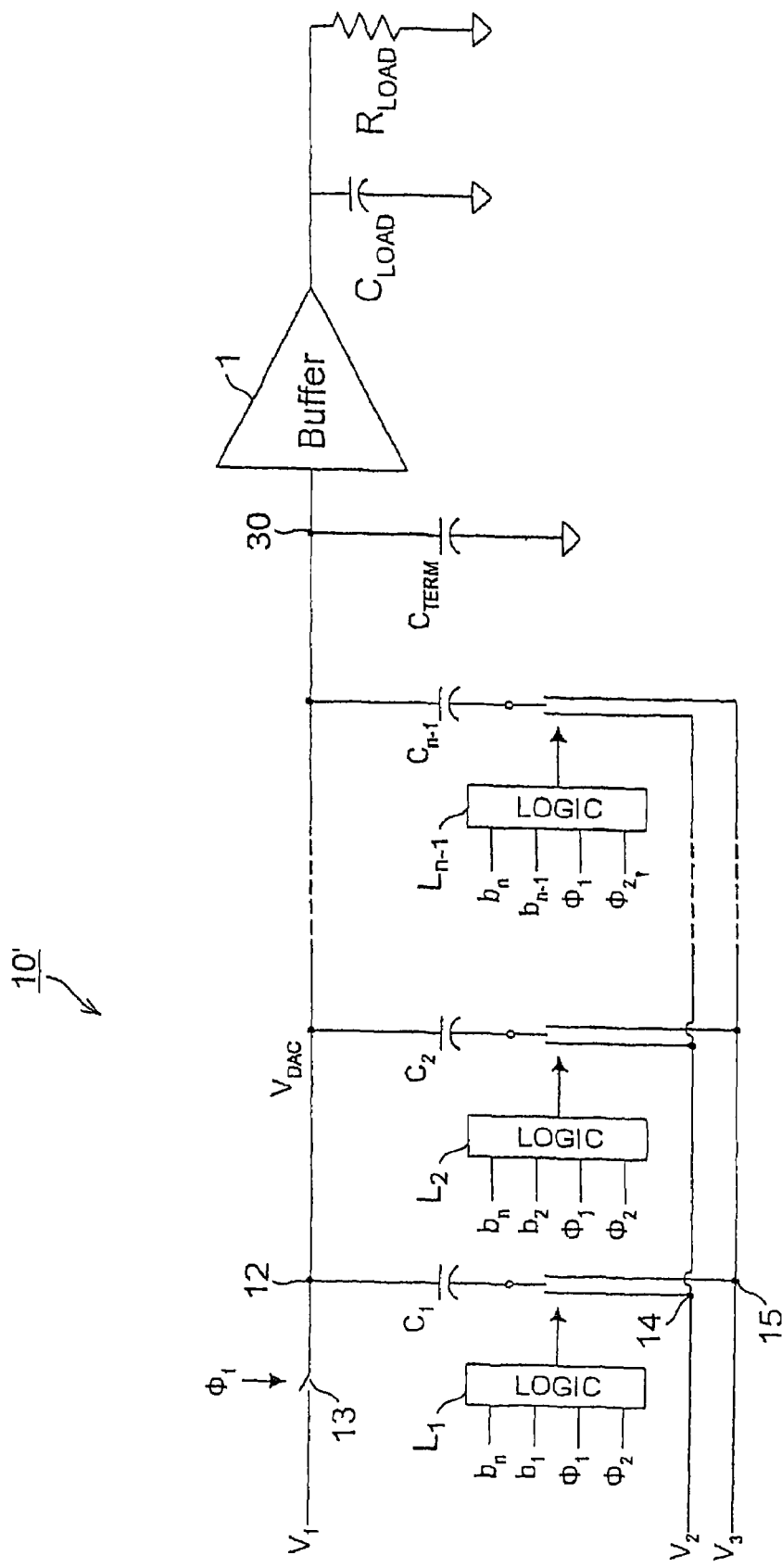
FIG. 18 is a block circuit diagram of a DAC arrangement according to a further embodiment of the invention.

FIG. 18 is a block circuit diagram of a digital/analogue converter 10' according to a further embodiment of the present invention. The DAC 10' of FIG. 18 is for converting an input n-bit digital code into an output voltage. The output 30 of the DAC 10' is connected to the input of a unity gain buffer amplifier 1. A terminating capacitor $C_{TERM}$ is connected between the input of the buffer 1 and ground. The output of the buffer 1 drives a load. In FIG. 18 the load is shown as a mixed capacitive and resistive load with a capacitive component $C_{LOAD}$ and a resistive component $R_{LOAD}$. However, the load may alternatively be a purely resistive load or a purely capacitive load.

The DAC 10' of FIG. 18 corresponds to the DAC 10 of FIG. 12, and its description will not be repeated.

Other digital/analogue converters of the present invention may also be used to drive a load via a buffer in the manner shown in FIG. 18.

INDUSTRIAL APPLICABILITY

A converter or converter arrangement of the invention may be incorporated in a display driver for driving a display device, for example in a display driver for driving a data line of an active matrix liquid crystal device.

The invention claimed is:

1. A switched capacitor digital/analogue converter comprising a conversion capacitance controlled by at least some of the bits of an input word and a terminating capacitance directly controlled by a switch which is controlled by at least one of the bits of the input word.

2. A converter as claimed in claim 1, in which the conversion capacitance comprises a plurality of conversion capacitors and the terminating capacitance comprises a plurality of terminating capacitors.

3. A converter as claimed in claim 2, in which the number of terminating capacitors is less than or equal to the number of conversion capacitors.

4. A converter as claimed in claim 2, in which each of the conversion capacitors is arranged to be connected to any selected one of a plurality of reference voltages, where the one of the references voltages to which the conversion capacitor is connected is selected as a function of the value of the respective bit of the input word.

5. A converter as claimed in claim 4, in which at least one of the terminating capacitors is arranged to be connected to one of the reference voltages in dependence on the value of at least one of the bits of the input word.

6. A converter as claimed in claim 1, in which the bits of the input word are logically inverted for application to the converter.

7. A converter as claimed in claim 1, in which least significant bits of the input word are inverted if a most significant bit has a first value and are not inverted if the most significant bit has a second value different from the first value.

8. A converter as claimed in claim 1, connected without buffering to a load, whose capacitance comprises part of the terminating capacitance.

9. A converter as claimed in claim 1, having an output arranged to be connected to a predetermined voltage when the input word represents a predetermined value.

10. A converter arrangement comprising a plurality of converters, each as claimed in claim 1, and a selecting arrangement for enabling one of the converters, determined by at least one most significant bit of the input word, to convert at least the other bits of the input word.

11. An arrangement as claimed in claim 10, comprising first and second converters, the selecting arrangement being arranged to supply the other bits without logical inversion to the first converter and to supply the other bits following logical inversion to the second converter.

12. A display including switched capacitor digital/analogue converter for performing at least partial gamma correction, the converter comprising a conversion capacitance controlled by at least some of the bits of an input word and a terminating capacitance directly controlled by a switch is controlled by at least one of the bits of the input word.

13. A display as claimed in claim 12, in which the conversion capacitance comprises a plurality of conversion capacitors and the terminating capacitance comprises a plurality of terminating capacitors.

14. A display as claimed in claim 13, in which the number of terminating capacitors is less than or equal to the number of conversion capacitors.

15. A display as claimed in claim 13 in which each of the conversion capacitors is arranged to be connected to any selected one of a plurality of reference voltages, where the one of the references voltages to which the conversion capacitor is connected is selected as a function of the value of the respective bit of the input word.

16. A display as claimed in claim 15, in which at least one of the terminating capacitors is arranged to be connected to one of the reference voltages in dependence on the value of at least one of the bits of the input word.

17. A display as claimed in claim 12, in which the bits of the input word are logically inverted for application to the converter.

18. A display as claimed in claim 12, in which least significant bits of the input word are inverted if a most significant bit has a first value and are not inverted if the most significant bit has a second value different from the first value.

19. A display as claimed in claim 12, connected without buffering to a load, whose capacitance comprises part of the terminating capacitance.

20. A display as claimed in claim 12, having an output arranged to be connected to a predetermined voltage when the input word represents a predetermined value.

21. A display including an arrangement for performing at least partial gamma correction and comprising:

a plurality of switched capacitor digital/analogue converters, each of which comprises a conversion capacitance controlled by at least some of the bits of an input word and a terminating capacitance directly controlled by a switch which is controlled by at least one of the bits of the input word; and a selecting arrangement for enabling one of the converters, determined by at least one most significant bit of the input word, to convert at least the other bits of the input word.

22. A display as claimed in claim 21, comprising first and second converters, the selecting arrangement being arranged to supply the other bits without logical inversion to the first converter and to supply the other bits following logical inversion to the second converter.

23. A display as claimed in claim 12 comprising a liquid crystal device.

\* \* \* \* \*